(12) United States Patent
Marshall

(10) Patent No.: US 6,570,948 B1
(45) Date of Patent: May 27, 2003

(54) PHASE LOCKED LOOP FREQUENCY GENERATING CIRCUIT AND A RECEIVER USING THE CIRCUIT

(75) Inventor: Paul R. Marshall, Redhill (GB)

(73) Assignee: Koninklijke Phillips Electronics N.V., Eindhoven (NL)

( * ) Notice: Subject to any disclaimer, the term of this patent is extended or adjusted under 35 U.S.C. 154(b) by 192 days.

(21) Appl. No.: 09/663,635

(22) Filed: Sep. 18, 2000

(30) Foreign Application Priority Data

Sep. 24, 1999 (GB) ............................................. 9922573

(51) Int. Cl.⁷ ................................................ H03D 3/24
(52) U.S. Cl. ............................. 375/376; 327/147; 331/2
(58) Field of Search ............................... 375/376, 327; 331/2; 327/147, 156

(56) References Cited

U.S. PATENT DOCUMENTS

| | | | |
|---|---|---|---|
| 3,588,732 A | 6/1971 | Tollefson | 331/2 |
| 4,388,597 A * | 6/1983 | Bickley et al. | 331/2 |
| 4,940,950 A | 7/1990 | Helfrick | 331/2 |
| 5,319,680 A * | 6/1994 | Port et al. | 375/376 |
| 5,408,201 A | 4/1995 | Uriya | 331/2 |
| 5,422,604 A | 6/1995 | Jokura | 331/2 |

FOREIGN PATENT DOCUMENTS

WO   WO9930420   6/1999   ............. H03L/7/23

* cited by examiner

Primary Examiner—Temesghen Ghebretinsae
(74) Attorney, Agent, or Firm—Kevin Simons

(57) ABSTRACT

A frequency generating circuit comprises a first, fine PLL frequency synthesiser circuit (FS2) which consumes a low current and is slow to settle, a second, coarse PLL frequency synthesiser circuit (FS1) which consumes a high current and is fast to settle, and a signal combining circuit (36) for additively combining the outputs of the first and second frequency synthesiser circuits to provide a final output frequency. The first frequency synthesiser circuit is energised sufficiently in advance of the second frequency synthesiser circuit that both achieve lock substantially simultaneously. The overall current consumed is less than would be consumed if a single PLL frequency synthesiser is used to generate the final frequency.

8 Claims, 3 Drawing Sheets

PHASE LOCKED LOOP FREQUENCY GENERATING CIRCUIT AND A RECEIVER USING THE CIRCUIT

Figure 1:
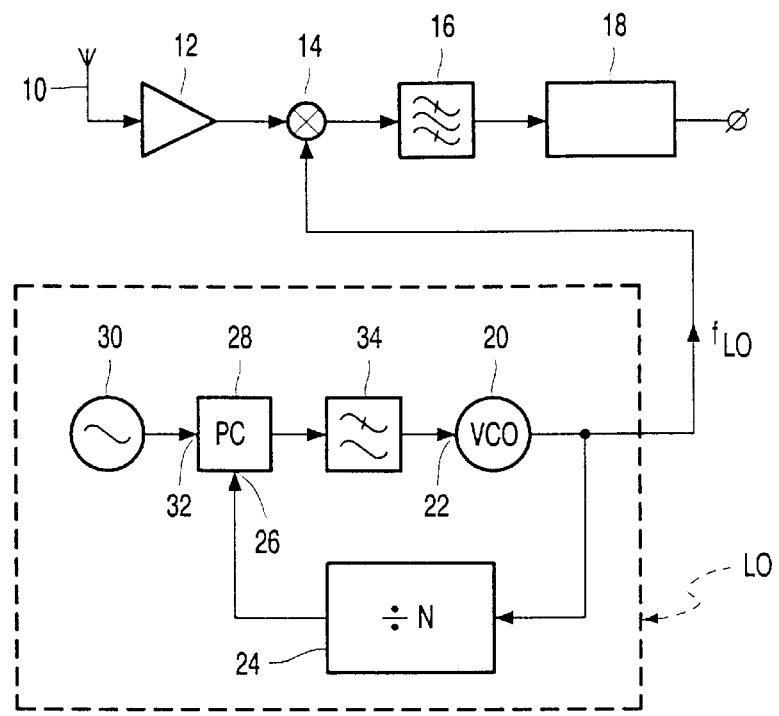

The present invention relates to a phase locked loop (PLL) frequency generating circuit and to a receiver using the circuit. The present invention has particular but not exclusive application in low energy consuming devices such as battery operated wireless devices used in computer peripherals, security systems, thermostats, low power personal area network devices, telemetry systems, battery operated network interfaces such as Bluetooth and wireless Ethernet, and personal communications devices such as pagers and mobile telephones.

A problem in low power radio systems is the need to check frequently the radio channel for activity. A frequency synthesiser is often used to generate the local oscillator frequency which provides channel selection in a receiver.

A low channel spacing is achieved with a low comparison frequency in the frequency synthesiser. The low comparison frequency dictates the maximum frequency response for the loop filter. This in turn limits the settling speed of the frequency synthesiser. A significant portion of the energy needed to check the channel for activity is used waiting for the frequency synthesiser to settle. Starting the oscillator and waiting for it to settle on the correct frequency can take a longer time than the time required by the receiver to determine if there is signal present. Known techniques for reducing the lock time include switchable loop filters in which after a short period of fast settling, the loop filter characteristic is changed to give low phase noise, and fractional-N frequency synthesisers in which the comparison frequency is higher than the channel spacing and the synthesiser loop is made to settle quickly.

It is an object of the present invention to reduce the lock time in a frequency generating circuit.

According to one aspect of the present invention there is provided a phase locked loop(PLL) frequency generating circuit comprising coarse signal generating means, fine signal generating means, signal combining means having inputs coupled respectively to outputs of the coarse and fine signal generating means and an output for a predetermined frequency comprising the sum of the signals produced by the coarse and fine signal generating means.

In an embodiment of the frequency generating circuit the fine signal generating means which is low current consuming and slow to settle is energised sufficiently in advance of the coarse signal generating means which is high current consuming and fast to settle that both circuits achieve lock substantially simultaneously.

According to a second aspect of the present invention there is provided a receiver comprising an input for a radio frequency signal, a frequency down conversion stage having a first input coupled to the radio frequency input, a second input coupled to a source of local oscillator signals, and an output for a frequency down converted signal, the source of local oscillator signals comprising coarse signal generating means, fine signal generating means, and signal combining means having inputs coupled respectively to outputs of the coarse and fine signal generating means and an output for the local oscillator signal comprising a sum of the signals produced by the coarse and fine signal generating means.

US Patent Specification 3,588,732 discloses a frequency synthesiser comprising two phase locked loops(PLLs) which derive their reference frequencies from a common stable, higher frequency source which ensures that the reference frequencies, which are obtained by dividing down the common frequency, are phase locked. The divisors selected are such that the two reference frequencies differ by a relatively small quantitative frequency value, for example 100 Hz. The cited circuit differs from the frequency generating circuit made in accordance with the present invention in that the output frequencies from the two PLLs are not added to provide the output frequency. The VCO of one of the two PLLs generates the output frequency supplied to utilising equipment and also supplies this frequency to a first, non-inverting input of a signal combiner. The VCO of the second of the two PLLs is supplied to the inverting input of the signal combiner so that the difference between the two VCO frequencies is supplied to the divider of the first of the two PLLs which ensures that its VCO is able to supply small incremental value frequency steps. In this cited frequency synthesiser there is no disclosure of having independent fine and coarse PLL circuits which can be energised at different instants in time.

US Patent Specification 5,422,604 discloses a frequency synthesiser comprising first and second PLL synthesisers the outputs of which are combined. In order to reduce unwanted oscillations when changing frequency the first and second PLL synthesisers are operated so that a frequency change $\Delta f$ is effected in a two stage operation. In the first stage the first PLL synthesiser has its frequency $f_1$, increased by $\Delta f$ to become $(f_1+\Delta f)$ and the second PLL synthesiser's frequency $f_2$ remains unchanged. In the second stage the first PLL synthesiser's frequency is reduced by $\Delta f$ to become $f_1$ again and the second PLL synthesiser's frequency is increased by $\Delta f$ to become $(f_2+\Delta f)$. This citation does not disclose the provision of coarse and fine PLL frequency synthesisers which are energised at different times so that they achieve lock substantially simultaneously.

Figure 2:
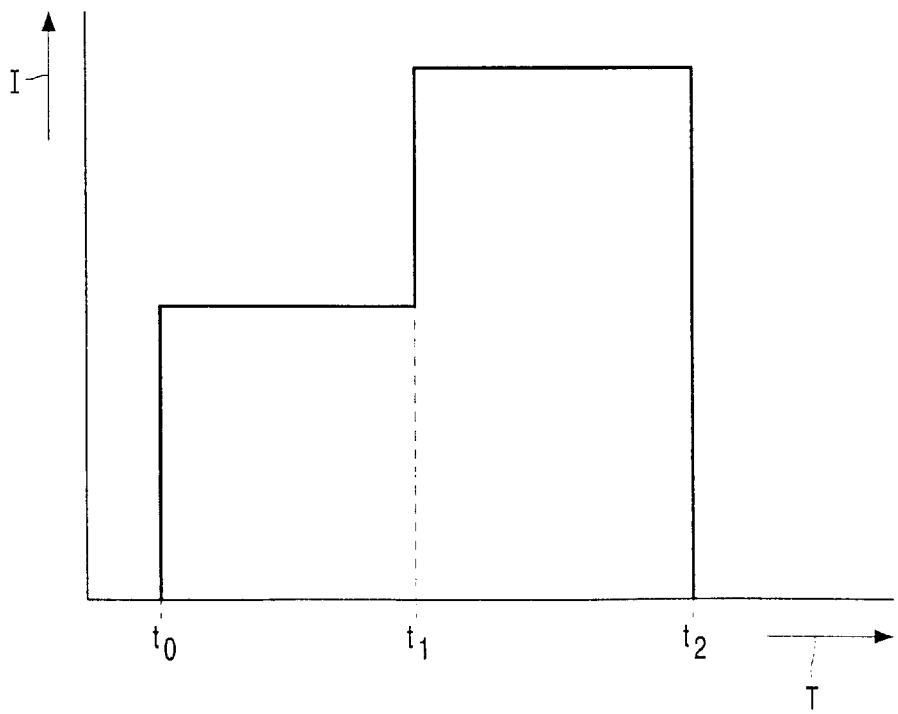
Figure 3:
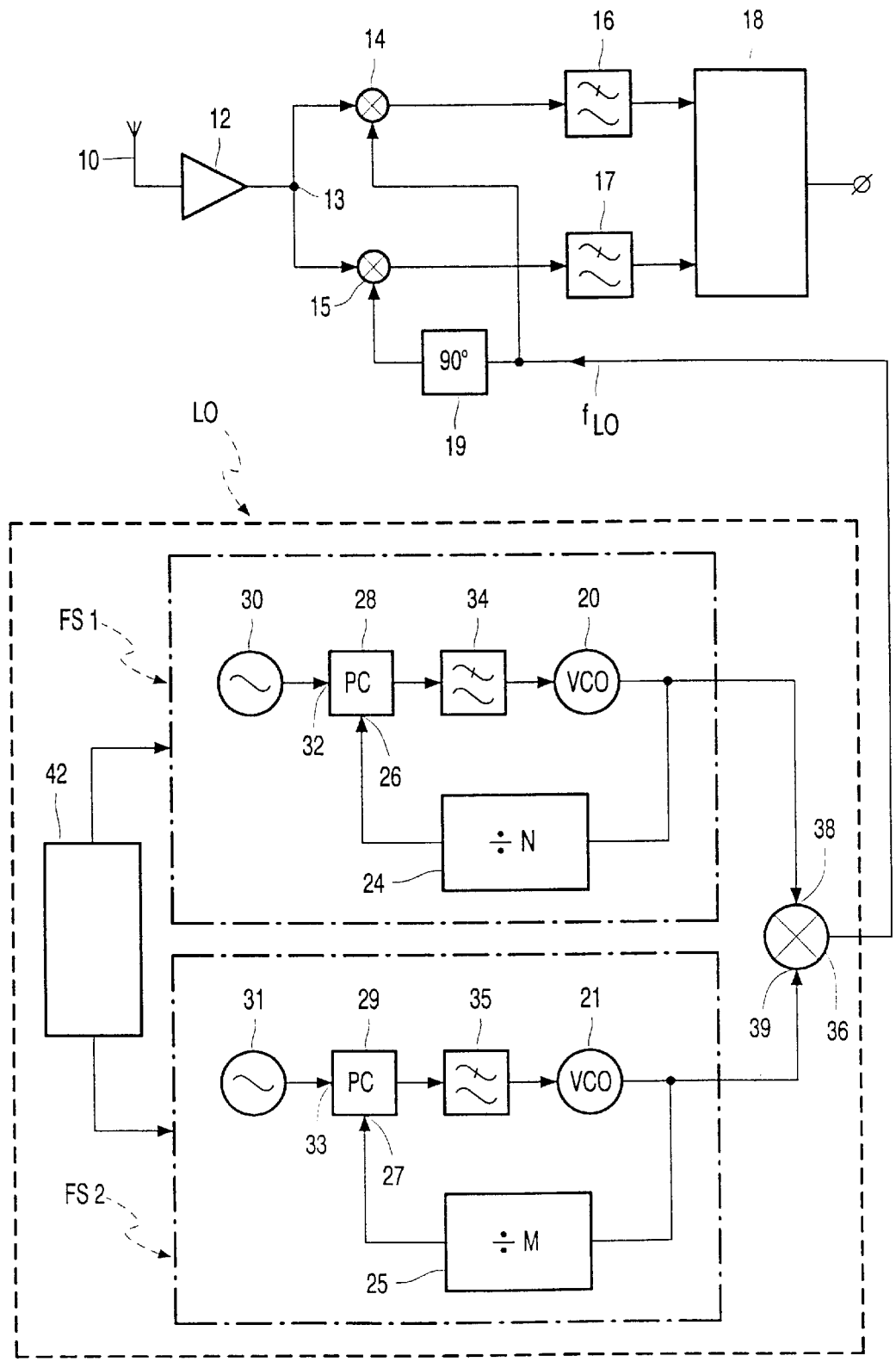
Figure 4:
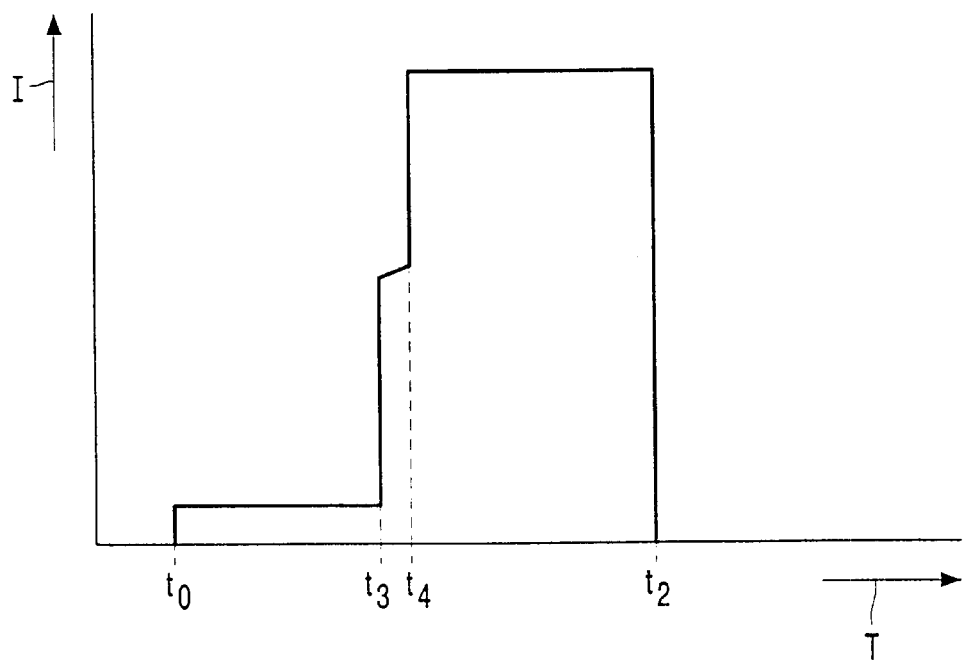

The present invention will now be described, by way of example, with reference to the accompanying drawings, wherein:

FIG. 1 is a block schematic diagram of a superhet receiver having a known local oscillator circuit, FIG. 2 is a graph of time, T, versus current consumption, I, illustrating the current consumed by the receiver shown in FIG. 1, FIG. 3 is a block schematic diagram of a zero-IF (or baseband) receiver having a local oscillator circuit made in accordance with the present invention, and FIG. 4 is a graph of time, T, versus current consumption, I, illustrating the current consumed by the receiver shown in FIG. 3.

In the drawings the same reference numerals have been used to identify corresponding features.

For convenience of description, reference is made to using phase locked loop (PLL) frequency generating circuits as local oscillators for radio receivers, which may be superhet or zero-IF receivers, but it is to be understood that the frequency generating circuits may be used with other suitable utilising devices.

Referring to FIG. 1, the radio receiver comprises an antenna 10 coupled to a RF amplifier 12 which is connected to a superhet frequency down conversion stage consisting of a mixer 14 which is supplied with a local oscillator LO. A filter 16 is used to select the required IF signal from the products of mixing. A demodulator 18 is used to recover the modulating signal from the IF signal at the output of the filter 16.

The local oscillator LO is a conventional PLL frequency synthesiser which comprises a VCO 20 supplying the local oscillator signal $f_{LO}$ in response to a control voltage on its input 22. The output of the VCO 20 is supplied to a frequency divider 24 which divides the frequency $f_{LO}$ by a divisor N. An output of the frequency divider 24 is coupled to one input 26 of a phase comparator (PC) 28. A stable reference frequency source 30 is coupled to a second input 32 of the phase comparator 28. An output representative of the frequency difference between the signals at the inputs 26 and 32 of the phase comparator 28 is applied to a low pass filter 34 which integrates the signal on its input to provide the control voltage which is applied to the input 22 of the VCO 20.

The operation of the LO circuit is well known and accordingly will not be described.

A particular application of this type of receiver is in a terminal unit of a telemetry system. Such units typically switch-on the receiver at frequent intervals to check the radio channel for traffic and particularly for point-to-point messages being sent to it. The frequent switching-on and -off is known in the art as "sniffing".

Referring to FIG. 2, in order to switch-on the receiver it is necessary to power-up the local oscillator LO and wait for it to settle on the correct frequency, time period $t_0$ to $t_1$. This operation can take longer than the time required by the receiver, time period $t_1$ to $t_2$, to determine if there is a signal present and, if not, to power down again.

The zero—IF (or baseband) receiver shown in FIG. 3 comprises an antenna 10 coupled to an RF amplifier 12, the output of which is coupled to a signal splitter represented by a junction 13. The junction 13 is coupled to signal inputs of quadrature related mixers 14, 15. A local oscillator signal $f_{LO}$ obtained from a local oscillator LO is applied to a local oscillator input of the mixer 14 and by way of a 90 degree phase shifter 19 to a local oscillator input of the mixer 15. The products of mixing from the respective mixers 14, 15 are applied to low pass filters 16, 17 which select the difference or zero—IF products. A demodulator 18 is coupled to the low pass filters 16, 17 to derive the modulating signals.

The local oscillator LO comprises two independently controllable PLL frequency synthesisers FS1 and FS2, the output frequencies of which are combined in an image reject mixer 36 to form the local oscillator signal $f_{LO}$.

The PLL frequency synthesiser FS1 is a relatively high current consuming circuit running at, or near, the channel frequency and behaves as a coarse oscillator. It is restricted to tuning in large frequency steps which will allow a high synthesiser comparison frequency. This will lead to a large loop bandwidth and rapid settling time.

The PLL frequency synthesiser FS1 comprises a reference oscillator 30 generating a high comparison frequency coupled to an input 32 of a phase comparator 28. An output of the phase comparator 28 is coupled to a low pass filter 34 which provides a slowly changing control voltage to a VCO 20. An output of the VCO 20 is coupled to an input 38 of the image reject mixer 36 and to an input of a divide by N divider 24. An output of the divider 24 is coupled to an input 26 of the phase comparator 28 thus completing the PLL.

The PLL frequency synthesiser FS2 is a relatively low current consuming circuit running at relatively low frequencies and behaves as a fine oscillator. It is restricted to tuning in small frequency steps and hence gives a slower loop settling time.

The PLL frequency synthesiser FS2 comprises a reference oscillator 31 generating a low comparison frequency coupled to an input 33 of a phase comparator 29. An output of the phase comparator 29 is coupled to a low pass filter 35 which provides the control voltage to a VCO 21. An output of the VCO 21 is coupled to an input 39 of the image reject mixer 36 and to an input of a divide by M divider 25. An output of the divider 25 is coupled to an input 27 of the phase comparator 29 thus completing the PLL.

The outputs of the VCOs 20, 21 are mixed in the image reject mixer 36 and the sum product gives the required local oscillator frequency $f_{LO}$. Because the coarse and fine frequencies are added together, any channel frequency can be selected.

More particularly to obtain a wanted frequency $f_{LO}$, the divisors N, M of both the dividers 24, 25 must be programmed. The divisor N is selected to tune the VCO 20 to the closest multiple of the reference oscillator's 30 frequency that is below the wanted frequency, for example in order to generate a wanted frequency of 2438.5 MHz using a reference (or comparison) frequency of 80 MHz, N would be programmed to have a value 30 thus tuning the coarse VCO 20 to 2400 MHz.

The difference between the wanted frequency of 2438.5 MHz and the coarse frequency from the PLL frequency synthesiser FS1 must be a multiple of the low comparison frequency from the reference oscillator 31, for example 500 kHz. The divisor M of the divider 25 is programmed to a value of 77 to enable the fine VCO 21 to tune to 38.5 MHz.

The image reject mixer 36 adds the coarse and fine frequencies of 2400 MHz and 38.5 MHz together to give a wanted frequency $f_{LO}$ of 2438.5 MHz.

A controller 42 is coupled to both PLL frequency synthesisers FS1 and FS2 to control their powering-up and -down in order to save current.

Referring to FIG. 4, the controller 42 powers-up the PLL frequency synthesiser FS2 first at time $t_0$ and it begins to acquire phase lock. At time $t_3$ the PLL frequency synthesiser FS1 is powered-up and, because it has a higher loop bandwidth, it acquires phase lock rapidly. At time $t_4$ both frequency synthesisers FS1 and FS2 have achieved lock and the receiver is enabled to "sniff" the channel. If there is no signal for the receiver it powers down at time $t_2$.

Comparing the areas under the graphs in FIGS. 2 and 4, less current is used by the frequency generating arrangement shown in FIG. 3. The tabular summaries below give an example of the energy savings that can be obtained from an application in the 2.4 GHz ISM band. The frequency generating arrangement of FIG. 3 is estimated to give an energy saving of 72% over that of the conventional frequency synthesiser of FIG. 1.

| Conventional synthesiser of FIG. 1 | | |
| --- | --- | --- |
| Synthesiser Step size | 500 kHz | |
| Time to Acquire lock | 224 µs | |
| Oscillator current | 10 mA | |
| Synthesiser Current | 10 mA | from SA 8026 Data sheet |
| Receiver Current | 38 mA | from SA2420 & SA639 data |
| Time to determine channel clear | 22 µs | 802.11 CCA specification |
| Total energy to sniff Channel | 4.48e − 6 µJ + 1.3e − 6 µJ = 5.8 µJ | |

| Synthesiser Arrangement of FIG. 3 | |
| --- | --- |
| Fine Synthesiser step size | 500 kHz |
| Time for fine synthesiser to acquire lock | 224 µs |

-continued

Synthesiser Arrangement of FIG. 3

| | | |
|---|---|---|
| Fine Oscillator Current | 1 mA | |
| Fine Synthesiser Current | 0.3 mA | Scaled from SA 8026 |
| Coarse Synthesiser step size | 80 MHz | |
| Time for coarse synthesiser to Acquire lock | 1.4 μs | scaled from step size change |
| Coarse Oscillator Current | 10 mA | |
| Coarse Synthesiser Current | 10 mA | from SA 8026 Data sheet |
| Receiver Current: | 38 mA | SA 2420 & SA639 |
| Time to determine channel clear | 22 μs | 802.11 CCA Specification |
| Total energy to sniff Channel: | 2.91e − 7 + 2.8e − 8 + 1.3e − 6 = 1.6 μJ | |

In the present specification and claims the word "a" or "an" preceding an element does not exclude the presence of a plurality of such elements. Further, the word "comprising" does not exclude the presence of other elements or steps than those listed.

From reading the present disclosure, other modifications will be apparent to persons skilled in the art. Such modifications may involve other features which are already known in the design, manufacture and use of frequency generating circuits and components therefor and which may be used instead of or in addition to features already described herein.

What is claimed is:

1. Phase locked loop (PLL) frequency generating circuit comprising coarse signal generating means, fine signal generating means, signal combining means having inputs coupled respectively to outputs of the coarse and fine signal generating means and an output for a predetermined frequency comprising the sum of the signals produced by the coarse and fine signal generating means; and
    a control means for energising the fine signal generating means sufficiently in advance of energising the coarse signal generating means that they achieve lock substantially simultaneously.

2. Phase locked loop frequency generating circuit as claimed in claim 1, characterised in that the coarse signal generating means comprises a first PLL frequency synthesiser including a first voltage controlled oscillator(VCO) providing an output frequency, a first frequency scaler coupled to the first VCO output, a first phase comparator for comparing the output of the first scaler with a first reference frequency, an output of the first phase comparator providing a control signal for tuning the first VCO, and in that the frequency of the first reference frequency is selected together with the dividing ratio of the first scaler to cause the first VCO to generate a frequency which is the closest multiple of the first reference frequency below the predetermined frequency at the output of the signal combining means.

3. Phase locked loop frequency generating circuit as claimed in claim 1, characterised in that the fine signal generating means comprises a second PLL frequency synthesiser including a second voltage controlled oscillator (VCO) providing an output frequency, a second frequency scaler coupled to the second VCO output, a second phase comparator for comparing the output of the second scaler with a second reference frequency, an output of the second phase comparator providing a control signal for tuning the second VCO, and in that the frequency of the second reference frequency is selected together with the dividing ratio of the second scaler to provide a multiple of the second reference frequency which is equal to the frequency difference between the predetermined frequency and the frequency of the coarse signal generating means.

4. A receiver comprising an input for a radio frequency signal, a frequency down conversion stage having a first input coupled to the radio frequency input, a second input coupled to a source of local oscillator signals, and an output for a frequency down converter signal, the source of local oscillator signals comprising coarse signal generating means, fine signal generating means, and signal combining means having inputs coupled respectively to outputs of the coarse and fine signal generating means and an output for the local oscillator signal comprising a sum of the signals produced by the coarse and fine signal generating means; and
    a control means for energising the fine signal generating means sufficiently in advance of energising the coarse signal generating means that they achieve lock substantially simultaneously.

5. A receiver as claimed in claim 4, characterised in that the coarse signal generating means comprises a first PLL frequency synthesiser including a first voltage controlled oscillator(VCO) providing an output frequency, a first frequency scaler coupled to the first VCO output, a first phase comparator for comparing the output of the first scaler with a first reference frequency, an output of the first phase comparator providing a control signal for tuning the first VCO, and in that the frequency of the first reference frequency is selected together with the dividing ratio of the first scaler to cause the first VCO to generate a frequency which is the closest multiple of the first reference frequency below the local oscillator frequency at the output of the signal combining means.

6. A receiver as claimed in claim 4, characterised in that the fine signal generating means comprises a second PLL frequency synthesiser including a second voltage controlled oscillator(VCO) providing an output frequency, a second frequency scaler coupled to the second VCO output, a second phase comparator for comparing the output of the second scaler with a second reference frequency, an output of the second phase comparator providing a control signal for tuning the second VCO, and in that the frequency of the second reference frequency is selected together with the dividing ratio of the second scaler to provide a multiple of the second reference frequency which is equal to the frequency difference between the local oscillator frequency and the frequency of the coarse signal generating means.

7. A local oscillator, comprising:
    a first phase locked loop based oscillator having an output terminal;
    a second phase locked loop based oscillator having an output terminal;
    a mixer having a first input terminal coupled to the output terminal of the first phase locked loop based oscillator, and a second input terminal coupled to the output terminal of the second phase locked loop oscillator;
    a controller coupled to the first and second locked loop oscillators, the controller adapted to supply and withhold power to each of the first and second phase locked loop oscillators;
    wherein the first phase locked loop based oscillator acquires lock in a first amount of time and the second phase locked loop based oscillator acquires lock in a second amount of time, the first amount of time being greater than the second amount of time; and wherein the controller is adapted to supply power first to the first phase locked loop based oscillator, and subsequently to the second phase locked loop based oscillator.

8. The local oscillator of claim 7, wherein the controller is adapted to supply power to the second phase locked loop based oscillator such that the first and second phase locked loop based oscillators acquire substantially the same time.

* * * * *